United States Patent
Liu et al.

(10) Patent No.: US 6,947,267 B2
(45) Date of Patent: Sep. 20, 2005

(54) RC CONTROLLED ESD CIRCUITS FOR MIXED-VOLTAGE INTERFACE

(75) Inventors: Meng-Huang Liu, Hsinchu (TW); Chun-Hsiang Lai, Taichung (TW); Shin Su, Taipei (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 80 days.

(21) Appl. No.: 09/853,591

(22) Filed: May 14, 2001

(65) Prior Publication Data

US 2002/0085328 A1 Jul. 4, 2002

(30) Foreign Application Priority Data

Jan. 3, 2001 (TW) ........................................ 90100154 A

(51) Int. Cl.[7] .................................................. H02H 3/22
(52) U.S. Cl. .......................................... 361/56; 361/111
(58) Field of Search ............................... 361/56, 57, 58, 361/91.1, 111, 54, 88, 91; 257/355, 356, 357, 358, 359, 360

(56) References Cited

U.S. PATENT DOCUMENTS

| | | | | |
|---|---|---|---|---|
| 4,887,021 A | * | 12/1989 | Walker | 323/279 |
| 5,283,707 A | * | 2/1994 | Conners et al. | 361/58 |
| 5,625,280 A | * | 4/1997 | Voldman | 323/284 |
| 5,631,793 A | * | 5/1997 | Ker et al. | 361/56 |
| 5,951,660 A | * | 9/1999 | Van Wonterghem | 710/302 |
| 6,118,640 A | * | 9/2000 | Kwong | 361/56 |
| 6,670,676 B1 | * | 12/2003 | Rahim | 257/355 |

* cited by examiner

*Primary Examiner*—Brian Sircus
*Assistant Examiner*—Danny Nguyen

(57) ABSTRACT

The present invention relates an electrostatic discharge (ESD) protection device that is applied to a mixed voltage circuit assembly. The device comprises a RC controlled circuit subassembly and a field transistor, which the RC controlled circuit is coupled with the mixed voltage circuit assembly to substantially control the ESD protection device to be ON or OFF. The field transistor is coupled between a first power supply and a second power supply of said mixed voltage circuit assembly, which is off on the condition of a normal operating condition and is conducting as an ESD event occurred.

26 Claims, 4 Drawing Sheets

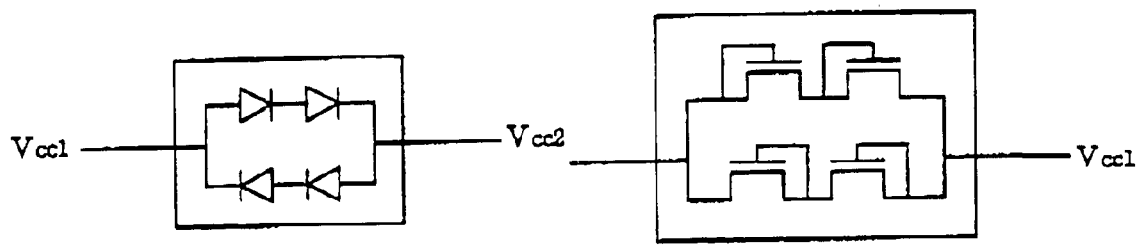
Fig. 3A
(Prior Art)
Fig. 3B
(Prior Art)
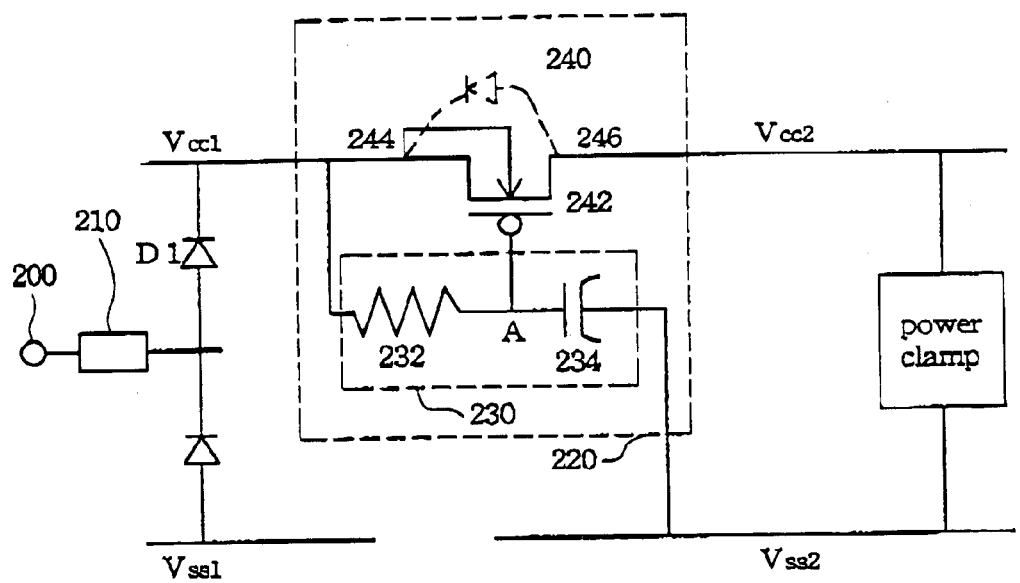
Fig. 4

US 6,947,267 B2

RC CONTROLLED ESD CIRCUITS FOR MIXED-VOLTAGE INTERFACE

FIELD OF THE INVENTION

The present invention relates to ESD (electrostatic discharge) protection circuits, and more specifically, to ESD protection circuits for integrated circuits'mixed-voltage interface.

BACKGROUND OF THE INVENTION

As more circuits and functions are integrated into a single chip, a chip often has more power pins to supply sufficient current for circuit operations. For different applications, the voltage levels in the circuits are different. As a result, in one integrated circuit there maybe different groups of power supplies with different voltage levels. Such integrated circuits, with different power supplies'voltage levels, have been called the mixed-voltage integrated circuits.

Due to the voltage levels'difference, the power lines and power pins in the integrated circuits have to be independently separated to avoid noise coupling between "dirty" and "clean" buses. However, a situation of electrostatic discharge may happen between any two circuits'pins, i.e., the electrostatic discharge current may flow into the circuits from one input or output pin and then flow out of the circuits form the other pin. Therefore, the separate mixed-voltage power system would induce ESD weakness.

For example, as shown in FIG. 1, one input/output power resource 100 is separate from one internal circuit 110. More specifically, each grounded pad of the I/O power 100 and the internal circuit 110, Vsso and Vssi , are separate by a resistance Rsub. Suppose one ESD pulse is applied to a pin 120 with respect to the ground pad Vssi, the ESD current may be discharged through the path 1, originally designed for ESD current. However, sometimes R sub may be large enough to introduce a large IR voltage drop, and thus results in a large voltage difference between the pin 120 and Vssi. If the voltage difference is so large that the unexpected path 2 is initiated to discharge the ESD current instead of the path 1, some internal device will be overstressed and then damaged.

On the other hand, as shown in FIG. 2, if an ESD device 130 exists to connect the I/O power supply, Vcco, with the internal circuits, Vcci, the ESD current can be discharged easily through the parasitic diode D1 and ESD device 130 to Vcci, then to trigger the ESD power clamp 140 between Vcci and Vssi, as the path 3 in FIG. 2. In this case, if an ESD device 150 is arranged to connect Vsso and Vssi, it will be more beneficial through the path 4 to discharge the ESD current from pad 120 to Vssi. The internal circuit would not suffer overstress and can be protected sufficiently. Thus, the ESD devices between the separate power supplies are very important to protect the internal circuits.

In the prior art, back-to-back or diode-connected devices are used to serve as ESD devices, as shown in FIGS. 3A and 3B respectively. The number of back-to-back or diode-connected devices depend on the following factors: (1) the requirement of noise immunity, or (2) the voltage difference between Vcc1 and Vcc2. For case (1), if the nominal Vcc1 supply voltage is the same as Vcc2, but the Vcc1 is expected to be noisier than Vcc2, then the diode number in the direction of Vcc1 to Vcc2 can be increased to enhance the noise immunity. However, the increased diode number would degrade the ESD device's protection efficiency. For case (2), if the Vcc1 supply voltage is larger than Vcc2, the voltage drop of the diode string in the direction of Vcc1 to Vcc2 has to be larger than the voltage difference. For example, at least 4 diodes will be needed to compensate for the supply voltage's difference of between 5V and 3.3V.

Utilizing a plurality of diodes to avoid the noise coupling between power supplies with different voltage levels would result in the protection efficiency degradation of ESD devices. Therefore, there is a need to improve the design of ESD devices.

SUMMARY OF THE INVENTION

It is an objective of this invention to provide a design of an electrostatic discharge (ESD) protection device.

It is another objective of this invention to provide a design of an electrostatic discharge protection device, applied to a mixed voltage circuit assembly.

It is a further objective of this invention to provide a design of an electrostatic discharge protection device, comprising a RC controlled circuit and a field transistor, applied to a mixed voltage circuit assembly, to achieve an ESD protection's function and noise immunity among I/O devices and core devices.

According to the objectives mentioned above, the invention discloses an electrostatic discharge protection device applied to a mixed voltage circuit assembly. The protection device comprises a RC controlled circuit and a field transistor. The RC controlled circuit is coupled with the mixed voltage circuit assembly, and is utilized to substantially controlling the ESD protection device to be ON or OFF. In addition, the field transistor is coupled between a first power supply and a second power supply of the mixed voltage circuit assembly. The field transistor's gate is coupled to the RC controlled circuit, and controls the field transistor turned off during a normal condition of the mixed voltage circuit assembly, and controls the field transistor to conduct as an ESD event to achieve a function of ESD protection.

The present invention's ESD protection device further comprises another field transistor to enhance a noise immunity function. The field transistor, utilized in the present invention's ESD protection device, could be PMOS transistor or NMOS transistor depending on different embodiments according to the present invention.

BRIEF DESCRIPTION OF THE DRAWINGS

For a more complete understanding of the invention, references are made to the following Detailed Description of the Preferred Embodiment taken in connection with the accompanying drawings in which:

FIG. 3A schematically illustrates an embodiment of the electrostatic discharge protection device of the prior art;

FIG. 3B schematically illustrates another embodiment of the electrostatic discharge protection device of the prior art;

FIG. 4 schematically illustrates a PMOS transistor utilized in the electrostatic discharge protection device of the mixed voltage circuit assembly of the present invention;

DETAILED DESCRIPTION OF THE PREFERRED EMBODIMENT

Figure 1:
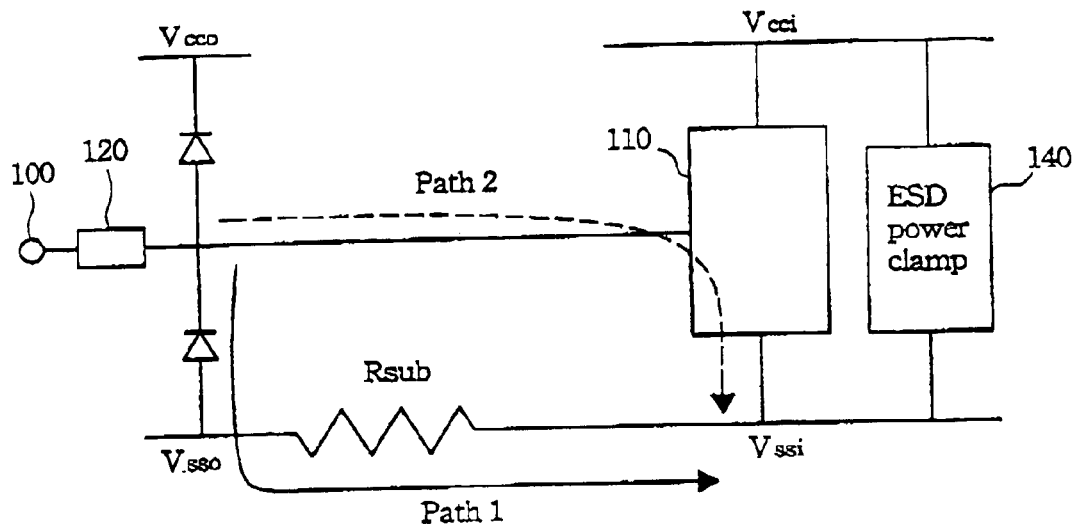
FIG. 1 schematically illustrates a mixed voltage circuit assembly.
Figure 2:
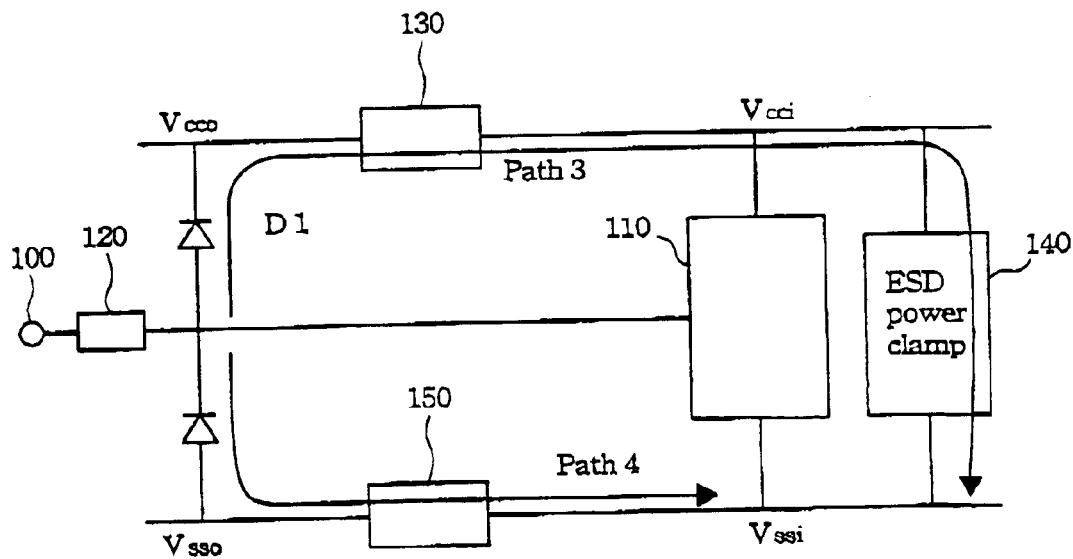
FIG. 2 schematically illustrates a mixed voltage circuit assembly with an electrostatic discharge protection device.

The present invention discloses an electrostatic discharge protection device, applied to a mixed voltage circuit assembly, comprising a RC controlled circuit and a field transistor. The RC controlled circuit is coupled with the mixed voltage circuit assembly, and is utilized to substantially control said ESD protection device to be ON or OFF and to distinguish the normal power-on condition of the mixed voltage circuit assembly from an ESD event.

In general, the rise time of the mixed voltage circuit IC assembly on the normal power-on condition is about a millisecond order. On the other hand, the rise time for an unexpected ESD event is about a nanosecond order. Therefore, the RC time constant of the present invention's RC controlled circuit design is between millisecond and nanosecond orders, such as a microsecond order, to substantially distinguish therebetween. For example, the RC controlled circuit comprises a resistance and a capacitor, wherein the resistance is about 100 K ohm ($\omega$) and the capacitor is about 10 pico-farad, and accordingly, the order of the RC time constant is about one microsecond. Therefore, the RC controlled circuit is able to substantially distinguish the normal power-on condition from an ESD event.

As shown in FIG. 4, an embodiment of the present invention is illustrated. One ESD device 220 is placed between two separated power lines and comprises a RC controlled circuit subassembly 230 and a PMOS transistor 240. As mentioned above, the order of the RC time constant is about one microsecond to substantially distinguish the normal power-on condition, with a one millisecond order, from an ESD event, with a one nanosecond order. More specifically, the RC controlled circuit subassembly 230 comprises a resistance 232 and a capacitor 234, while one end of the resistance 232 is coupled to the high voltage source Vcc1 of a first power supply 200, and the capacitor 234 is coupled to the low voltage source Vss2 of a second power supply (not shown) and the other end of the resistance 232. The gate 242 of the PMOS transistor 240 is coupled to a point A, between the resistance 232 and the capacitor 234, and the source 244 and the N-well (not shown) of the PMOS transistor 240 are designed to be coupled to the power supply, which is excepted to be noisier. According to the present embodiment, there are two conditions that need to be considered: (1) The high voltage source Vcc1 of the first power supply 200 has the same voltage level with the high voltage source Vcc2 of the second power supply, but Vcc1 is noisier than Vcc2. (2) The high voltage source Vcc1 of the first power supply 200 has a higher voltage level than the high voltage source Vcc2 of the second power supply. Under these two conditions, the source 244 and the N-well of the PMOS transistor 240 are coupled to the high voltage source Vcc1 of the power supply 200, and the drain 246 of the PMOS transistor 240 is coupled to the high voltage source Vcc2 of the second power supply.

Moreover, the RC time constant of the RC controlled circuit 230 of the ESD device 220 can substantially distinguish the normal power-on condition from a sudden ESD event, such as about 0.1 to 10 $\mu$sec. Therefore, the function of the RC controlled circuit 230 is similar to a switch between two power supplies. The details will be discussed below. Under a power-on condition or a normal operation condition, the order of the RC time constant of the RC controlled circuit 230 is microseconds far less than that of the normal condition. The voltage level of point A, thus, would follow the high voltage source Vcc1 of the first power supply 200. Furthermore, the source 244 and the N-well of the PMOS transistor 240 are coupled to the voltage source Vcc1 so that the PMOS transistor 240 would be in an off-condition and the high voltage source Vcc1 of the first power supply 200 would be separated effectively from the high voltage source Vcc2 of the second power supply. On the other hand, as the pin 210 of the first power supply 200 is stressed by a sudden ESD event, the voltage level of point A would not rapidly raise the voltage level of Vcc1 and would be lower than Vcc1, because of the order of the RC time constant of the RC controlled circuit 230 is far larger than that of the normal condition, the one nanosecond, so that the PMOS transistor 240 would be on a conducting condition, and accordingly Vcc1 would effectively conduct with Vcc2 through the PMOS transistor 240. The sudden ESD current would enter into the high voltage source Vcc2 of the second power supply and then flow into the low voltage source Vss2 of the second power supply via an ESD power clamp, located between Vcc2 and Vss2.

Under a normal condition, the RC controlled circuit subassembly 230 would block the connection of two independent power supplies, while the pin 210 has suffered an ESD event, the RC controlled circuit 230 and the PMOS transistor 240 will be performed as an ESD protection device to protect internal circuits from overstress. Considering the noise immunity of the direction from Vcc1 to Vcc2, the only possible leakage current is the sub-threshold leakage when the PMOS transistor 240 is in the off-condition, as illustrated above. Considering the noise immunity of the direction from Vcc2 to Vcc1, one parasitic diode, formed by an area, heavily doped by P-type ions, and the N-well of the PMOS transistor 240, will be utilized to discharge the noise signals from the second power supply.

Figure 5:
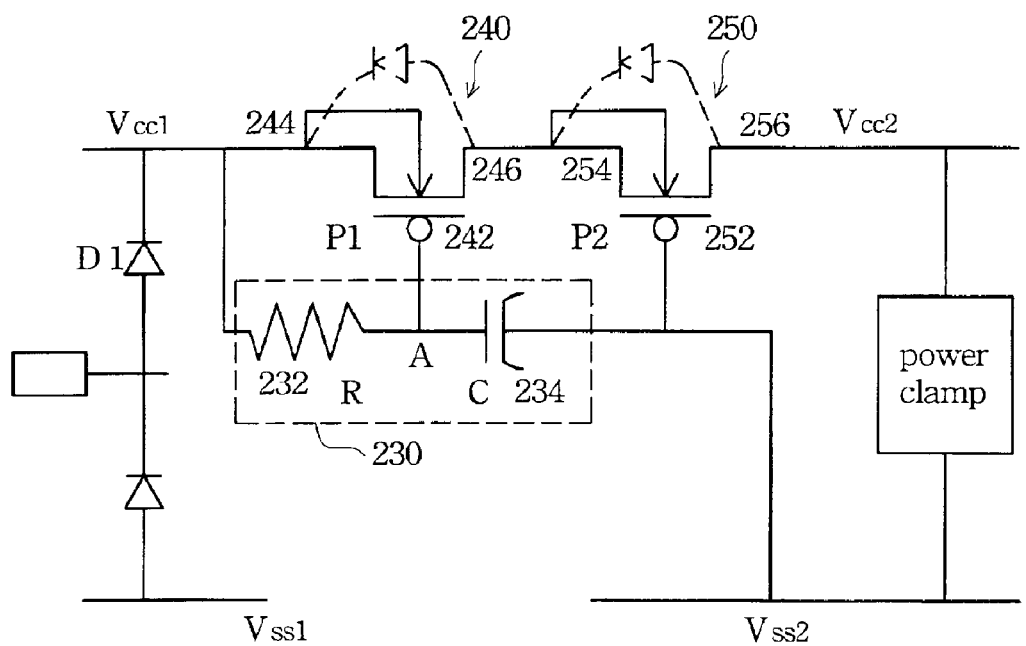
FIG. 5 schematically illustrates two PMOS transistors utilized in the electrostatic discharge protection device of the mixed voltage circuit assembly of the present invention.

Most of the noise that stresses the voltage source Vcc1 of the present embodiment is of the overshoot type. Sometimes, the-noise signal would be of the undershoot type. In this case, the PMOS transistor 240 would be performed as a parasitic diode, with forward bias of the direction from Vcc2 to Vcc1, according to the undershoot noise. The core devices used the second power supply would suffer noise interference. In order to enhance the capability of noise immunity of the direction from Vcc2 to Vcc1, the number of the PMOS transistor could be increased. As shown in FIG. 5, another PMOS transistor 250 is added to the ESD protection device 220. More specifically, the PMOS transistor 250 is located inside another N-well, and the gate of the second PMOS transistor 250 is coupled to the low voltage source Vss2 of the second power supply, the source and the N-well of the second PMOS transistor 250 are coupled to the drain 246 of the original PMOS transistor 240, the drain 256 of the second PMOS transistor 250 is coupled to the high voltage source Vcc2 of the second power supply. As a result, the PMOS transistor 250 would always be on a condition of conducting, and the condition of being ON or OFF of the PMOS transistor 240 would still be under the control of the RC controlled circuit 230. The condition of being active or inactive of the whole ESD protection device 220 is still under the control of both the RC controlled circuits 230 and the PMOS transistor 240. However, according to the additional PMOS transistor 250, the undershoot noise that comes from the Vcc1 must be large enough to overcome the voltage drop formed by the parasitic diode of two PMOS transistors. In other words, owing to the addition of the PMOS transistor 250, the capability of noise immunity of the ESD protection device 220 is enhanced.

Figure 6:
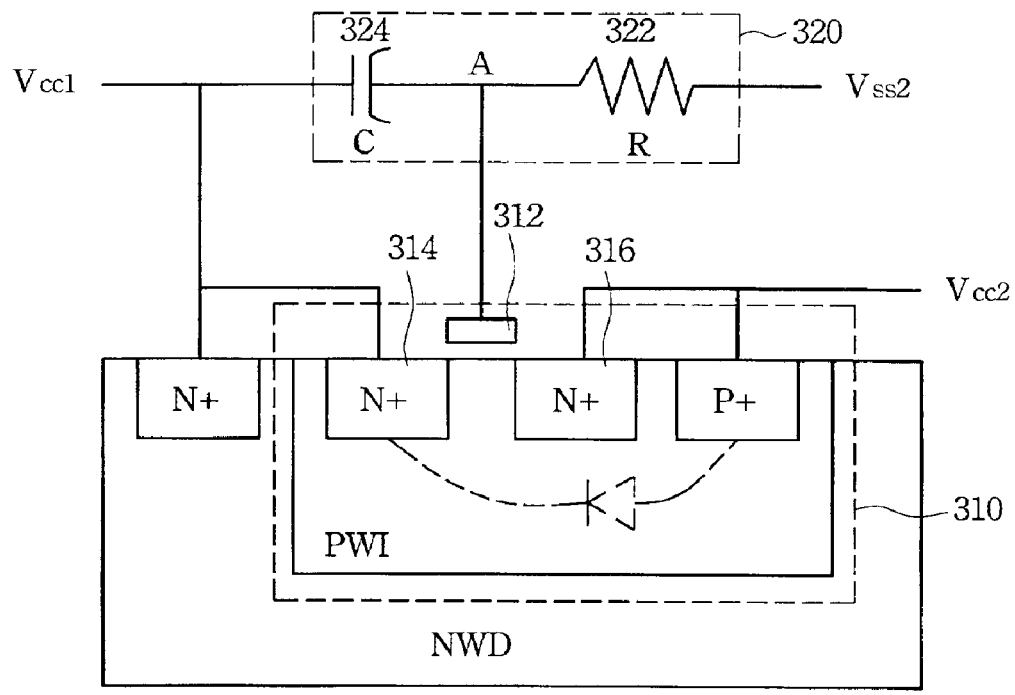
FIG. 6 schematically illustrates a NMOS transistor utilized in the electrostatic discharge protection device of the mixed voltage circuit assembly of the present invention.

In another embodiment of the present invention, a triple-well technology is performed to replace the PMOS transistor of the ESD protection device by the NMOS transistor. As illustrated in FIG. 6, a NMOS transistor 310 and its P-well (P-well inside the deep N-well, PWI) are located in a deep N-well (NWD). The RC controlled circuits'location direction of the resistance 322 and the capacitor 324, are used in the NMOS transistor and should be reversed in the PMOS transistor's direction location. One end of the capacitor 324 is coupled to the high voltage source Vcc1 of the first power supply and the resistance 322 is coupled to the low voltage source Vss2 of said second power supply and the other end of the capacitor 324. The gate 312 of the NMOS transistor 310 is coupled to a point A between the capacitor 324 and the resistance 322, and the drain 314 of the NMOS transistor 310 and the NWD are coupled to the high voltage source Vcc1, and the source 316 of the NMOS transistor 310 and the PWI are coupled to the high voltage source Vcc2. Moreover, the order of the RC time constant of the RC controlled circuit 320 is also one microsecond, which can substantially distinguish the normal power-on condition from a sudden ESD event to control the NMOS transistor to be ON or OFF.

As Vcc1 is stressed by a sudden ESD event, the voltage level of point A would raise the voltage level of Vcc1 and the resistance 322 could not discharge immediately so that the gate 312 of the NMOS transistor 310 would be conducting according to its high voltage level. The sudden ESD current would enter into the high voltage source Vcc2 of the second power supply from Vcc1 and then discharges the voltage via an ESD power clamp (not shown) of Vcc2. On the other hand, for a normal condition, the voltage level of point A is the same as Vss2, but lower than that of the high voltage source Vcc1, therefore, the gate 312 of the NMOS transistor 310 would be off and thus block the connection of two independent power supplies Vcc1 and Vcc2 to maintain independent operation of each power systems. If considering the noise immunity of the direction from Vcc2 to Vcc1 the parasitic diode, formed by the PWI and the NWD of the NMOS transistor 310, could be utilized to discharge the noise, came from Vcc2 to Vcc1.

Figure 7:
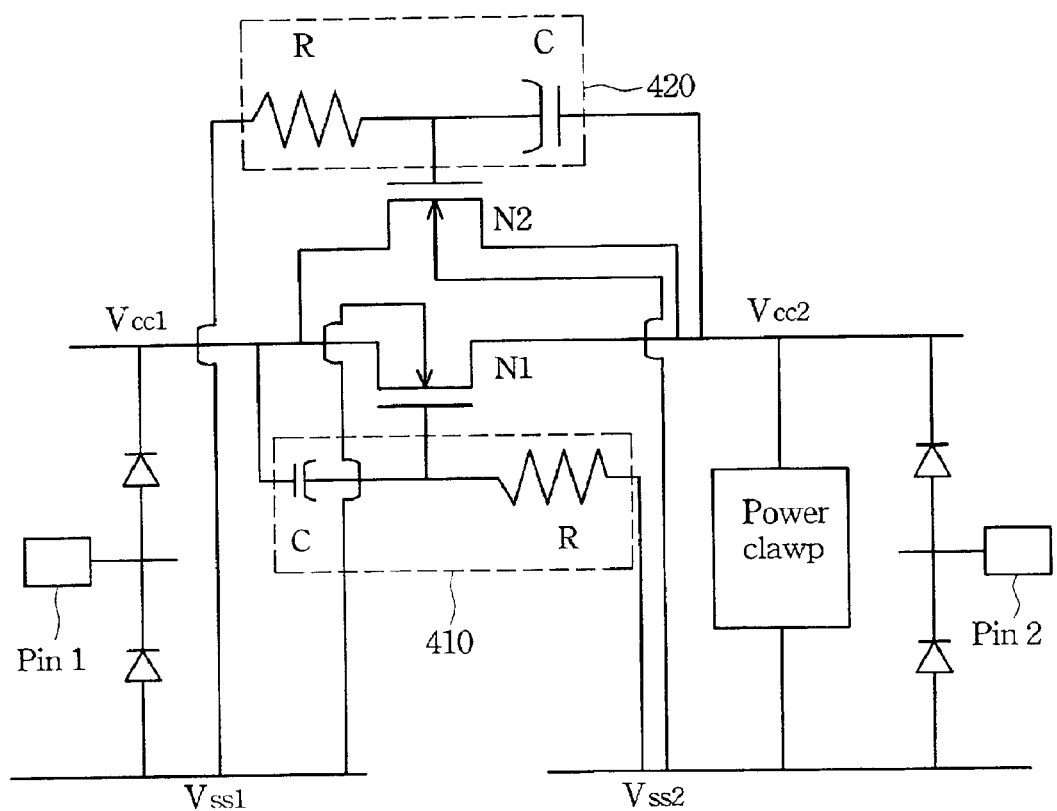
FIG. 7 schematically illustrates two electrostatic discharge protection devices, with two NMOS transistors, utilized in the mixed voltage circuit assembly of the present invention.

In the above-mentioned embodiments, a parasitic diode with a forward bias on the direction from Vcc2 to Vcc1 could be formed. However, the difference between the next embodiment and the above-mentioned is that two ESD protection devices are utilized to enhance the noise immunity of both directions, from pin 1 to pin 2 and from pin 2 to pin 1. The two ESD protection devices comprise two RC controlled circuit subassemblies and two NMOS transistors, as shown in FIG. 7. The first and the second NMOS transistors N1 and N2 are located in P-wells or P-substrates, which are separately coupled to the low voltage source Vss1 of the first power supply and the low voltage source Vss2 of the second power supply. N1 and N2 could not form parasitic diodes with forward bias. Instead, the first NMOS transistor N1 worked with the first RC controlled circuit 410, the first ESD protection device, are utilized to enhance the noise immunity of the direction from pin 1 to pin 2, while the second NMOS transistor N2 worked with the second RC controlled circuit 420, the second ESD protection device, are utilized to enhance the noise immunity of the direction from pin 2 to pin 1.

Although the invention has been described in detail herein with reference to its preferred embodiment, it is to be understood that this description is by way of example only, and is not to be interpreted in a limiting sense. It is to be further understood that numerous changes in the details of the embodiments are included within the spirit and scope of the present invention. Additional embodiments of the invention will be apparent, and may be made by persons of ordinary skill in the art, having reference to this description. It is understood that such changes and additional embodiments are within the spirit and true scope of the invention as claimed below.

We claim:

1. An electrostatic discharge (ESD) protection device, applied to a mixed voltage circuit as assembly with independent first and second power supplies, wherein the first power supply has a high voltage source and a low voltage source and the second power supply has a high voltage source and a low voltage source, said device comprising:

a RC controlled circuit subassembly, coupled with said mixed voltage circuit assembly, utilizing for substantially controlling said ESD protection device to be ON or OFF, wherein said RC controlled circuit subassembly comprising:
a resistance, one end of said resistance coupled to the high voltage source of said first power supply; and
a capacitor, one end of said capacitor coupled to the low voltage source of said second power supply and the other end of said capacitor coupled to said resistance; and a first transistor, the source electrode of said first transistor coupled to the high voltage source of said first power supply, the drain electrode of said first transistor coupled to the high voltage source of said second power supply and the gate electrode coupled to said RC controlled circuit subassembly for providing a current route between the high voltage source of said first power supply and the high voltage source of said second power supply on an ESD event, wherein said RC controlled circuit is used to control said first transistor to be ON or OFF.

2. The device as recited in claim 1, wherein the RC time constant of said resistance and said capacitor is about 0.1 to 10 $\mu$sec.

3. The device as recited in claim 1, wherein said first transistor is a first PMOS transistor, the gate of said first PMOS transistor being coupled between said resistance and said capacitor, the source of said first PMOS transistor being coupled to the high voltage source of said first power supply, the drain of said first PMOS transistor being coupled to the high voltage source of said second power supply.

4. The device as recited in claim 3, wherein said first PMOS transistor is further located in a first N-well, said first N-well being coupled to the high voltage source of said first power supply.

5. An electrostatic discharge (ESD) protection device, applied to a mixed voltage circuit assembly with a first power supply that has a high voltage source and a low voltage source and second power supply that has a high voltage source and a low voltage source, said device comprising:

a RC controlled circuit subassembly, coupled with said mixed voltage circuit assembly, utilizing for substantially controlling said ESD protection device to be ON or OFF, wherein said RC controlled circuit subassembly comprising:
a resistance, one end of said resistance coupled to the high voltage source of said first power supply; and
a capacitor, one end of said capacitor coupled to the low voltage source of said second power supply and the other end of said capacitor coupled to said resistance; and a first transistor, the source electrode of said first transistor coupled to the high voltage source of said first power supply, the drain electrode of said first transistor coupled to the high voltage source of said second power supply and the gate electrode coupled to said RC controlled circuit subassembly for providing a current route between the high voltage source of said first power supply and the high voltage source of said second power supply on an ESD event, wherein said RC controlled circuit is used to control said first transistor to be ON or OFF;

wherein said first transistor is a first PMOS transistor, the gate of said first PMOS transistor being coupled between said resistance and said capacitor, the source of said first PMOS transistor being coupled to the high voltage source of said first power supply, the drain of said first PMOS transistor being coupled to the high voltage source of said second power supply;

said first PMOS transistor is further located in a first N-well, said first N-well being coupled to the high voltage source of said first power supply; and said device further comprises a second PMOS transistor located in a second N-well, the gate of said second PMOS transistor being coupled to the low voltage source of said second power supply, the source of said second PMOS transistor and said second N-well being coupled to the drain of said first PMOS transistor, the drain of said second PMOS transistor being coupled to the high voltage source of said second power supply.

6. An electrostatic discharge (ESD) protection device, applied to a mixed voltage circuit assembly with a first power supply that has a high voltage source and a low voltage source and a second power supply that has a high voltage source and a low voltage source, said device comprising: a RC controlled circuit subassembly, coupled with said mixed voltage circuit assembly, utilizing for substantially controlling said ESD protection device to be ON or OFF, wherein said RC controlled circuit subassembly comprising:

a first capacitor, one end of said first capacitor being coupled to the high voltage source of said first power supply; and a first resistance, one end of said first resistance coupled to the low voltage source of said second power supply and the other end of said first resistance coupled to the first capacitor;

a first transistor, the source electrode of said first transistor coupled to the high voltage source of said first power supply, the drain electrode of said first transistor coupled to the high voltage source of said second power supply and the gate electrode coupled to said RC controlled circuit subassembly for providing a current route between the high voltage source of said first power supply and the high voltage source of said second power supply on an ESD event, wherein said RC controlled circuit is used to control said first transistor to be ON or OFF.

7. The device as recited in claim 6, wherein the RC time constant of said first resistance and said first capacitor is about 0.1 to 10 $\mu$sec.

8. The device as recited in claim 7, wherein said first transistor is a first NMOS transistor, the gate of said first NMOS transistor being coupled between said first capacitor and said first resistance, the drain of said first NMOS transistor being coupled to the high voltage source of said first power supply, the source of said first NMOS transistor being coupled to the high voltage source of said second power supply.

9. The device as recited in claim 8, wherein said first NMOS transistor is further located in a P-well, said P-well, located in a N-well, being coupled to the high voltage source of said first power supply.

10. The device as recited in claim 8, further comprising a second NMOS transistor, coupled between said first power supply and said second power supply of said mixed voltage circuit assembly, wherein said second NMOS transistor is coupled to said RC controlled circuit subassembly, said first NMOS transistor being conducting and said second NMOS transistor being off as a ESD current entering into said first power supply, said first NMOS transistor being off and said second NMOS transistor being conducting as an ESD current entering into said second power supply.

11. The device as recited in claim 10, wherein said RC controlled circuit subassembly further comprising:

a second capacitor, one end of said second capacitor being coupled to the high voltage source of said second power supply; and a second resistance, coupled to the low voltage source of said first power supply and the other end of said second capacitor, together with said second capacitor, utilizing for substantially controlling said second NMOS transistor to be ON or OFF.

12. The device as recited in claim 11, wherein the RC time constant of said second resistance and said second capacitor is about 0.1 to 10 $\mu$sec.

13. The device as recited in claim 11, wherein the gate of said second NMOS transistor is coupled between said second capacitor and said second resistance, the drain of said second NMOS transistor being coupled to the high voltage source of said second power supply, the source of said second NMOS transistor being coupled to the high voltage source of said first power supply.

14. The device as recited in claim 10, wherein said first NMOS transistor is further located in a first P-well.

15. The device as recited in claim 10, wherein said second NMOS transistor is further located in a second P-well.

16. An electrostatic discharge (ESD) protection device, applied to a mixed voltage circuit assembly, said device comprising;

a RC controlled circuit subassembly, coupled with said mixed voltage circuit assembly, comprising a resistance and a capacitor, the RC time constant of said resistance and said capacitor is between a rise time of an electrostatic discharge and a rise time of said mixed voltage circuit assembly on a normal power-on condition, utilizing for substantially controlling said ESD protection device to be ON or OFF;

a first PMOS transistor, coupled between a first power supply and a second power supply of said mixed voltage circuit assembly, wherein the gate of said first PMOS transistor is coupled between said resistance and said capacitor, and the source of said first PMOS transistor is coupled to the high voltage source of said first power supply; and a second PMOS transistor located in a second N-well, the gate of said second PMOS transistor being coupled to the low voltage source of said second power supply, the source of said second PMOS transistor and said second N-well being coupled to the drain of said first PMOS transistor, the drain of said second PMOS transistor being coupled to the high voltage source of said second power supply.

17. The device as recited in claim 16, wherein one end of said resistance is coupled to the high voltage source of said first power supply, and said capacitor is coupled to the low voltage source of said second power supply and the other end of said resistance, and the RC time constant of said resistance and said capacitor is about 0.1 to 10 μsec, utilizing for substantially controlling said first PMOS transistor to be ON or OFF.

18. The device as recited in claim 16, wherein said first PMOS transistor is further located in a first N-well, said first N-well being coupled to the high voltage source of said first power supply.

19. The device as recited in claim 18, wherein said second PMOS transistor located in a second N-well and said second N-well being coupled to the drain of said first PMOS transistor.

20. An electrostatic discharge (ESD) protection device, applied to a mixed voltage circuit assembly, said device comprising:

a RC controlled circuit subassembly, coupled with said mixed voltage circuit assembly, comprising a first resistance and a first capacitor, the RC time constant of said first resistance and said first capacitor is between a rise time of an electrostatic discharge and a rise time of said mixed voltage circuit assembly on a normal power-on condition, utilizing for substantially controlling said ESD protection device to be ON or OFF;

a first NMOS transistor, coupled between a first power supply and a second power supply of said mixed voltage circuit assembly, wherein the gate of said first NMOS transistor is coupled between said resistance and said capacitor, and the drain of said first NMOS transistor is coupled to the high voltage source of said first power supply, and the source of said first NMOS transistor is coupled to the high voltage source of said second power supply;

a second capacitor, one end of said second capacitor being coupled to the high voltage source of said second power supply;

a second resistance, being coupled to the low voltage source of said first power supply and the other end of said second capacitor; and a second NMOS transistor, coupled between said first power supply and said second power supply of said mixed voltage circuit assembly, wherein said second NMOS transistor is coupled between said second capacitor and said second resistance, said first NMOS transistor being conducting and said second NMOS transistor being off as an ESD current entering into said first power supply, said first NMOS transistor being off and said second NMOS transistor being conducting as an ESD current entering into said second power supply.

21. The device as recited in claim 20, wherein one end of said first capacitor is coupled to the high voltage source of said first power supply, and said first resistance is coupled to the low voltage source of said second power supply and the other end of said capacitor, and the RC time constant of said first resistance and said first capacitor is about 0.1 to 10 μsec, utilizing for substantially controlling said first NMOS transistor to be ON or OFF.

22. The device as recited in claim 20, wherein said first NMOS transistor is further located in a P-well, said P-well, located in a N-well, being coupled to the high voltage source of said second power supply.

23. The device as recited in claim 20, wherein the RC time constant of said second resistance and said second capacitor is about 0.1 to 10 μsec.

24. The device as recited in claim 20, wherein the gate of said second NMOS transistor is coupled between said second capacitor and said second resistance, the drain of said second NMOS transistor being coupled to the high voltage source of said second power supply, the source of said second NMOS transistor being coupled to the high voltage source of said first power supply.

25. The device as recited in claim 20, wherein said first NMOS transistor is further located in a first P-well.

26. The device as recited in claim 20, wherein said second NMOS transistor is further located in a second P-well.

* * * * *